US010571980B2

(12) United States Patent
Wang et al.

(10) Patent No.: US 10,571,980 B2
(45) Date of Patent: Feb. 25, 2020

(54) HYBRID COOLING CONTROL OF A COMPUTING SYSTEM

(71) Applicant: Hewlett Packard Enterprise Development LP, Houston, TX (US)

(72) Inventors: Zhikui Wang, Fremont, CA (US);
Tuong Q. Tran, Houston, TX (US);
Tahir Cader, Liberty Lake, WA (US);
Chunjian Ni, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/560,225

(22) PCT Filed: Apr. 7, 2015

(86) PCT No.: PCT/US2015/024707
§ 371 (c)(1),
(2) Date: Sep. 21, 2017

(87) PCT Pub. No.: WO2016/163994
PCT Pub. Date: Oct. 13, 2016

(65) Prior Publication Data
US 2018/0046232 A1 Feb. 15, 2018

(51) Int. Cl.
*G06F 1/20* (2006.01)
*G05D 23/19* (2006.01)
*H05K 7/20* (2006.01)

(52) U.S. Cl.
CPC ......... *G06F 1/206* (2013.01); *G05D 23/1919* (2013.01); *H05K 7/202* (2013.01);
(Continued)

(58) Field of Classification Search
CPC ..... G06F 1/206; G05D 23/1919; H05K 7/202
See application file for complete search history.

(56) References Cited

U.S. PATENT DOCUMENTS 8,406,929 B2 3/2013 Duncan
8,689,861 B2 4/2014 Campbell
(Continued)

FOREIGN PATENT DOCUMENTS

CN 1666896 A 9/2005
CN 101539374 A 9/2009
(Continued)

OTHER PUBLICATIONS

Li, L.; "Coordinating Liquid and Free Air Cooling Withworkload Allocation for Data Center Power Minimization"; Jun. 18-20, 2014; 12 pages.

*Primary Examiner* — Vincent H Tran
(74) *Attorney, Agent, or Firm* — Brooks, Cameron & Huebsch, PLLC

(57) ABSTRACT

In one implementation, a system for hybrid cooling control of a computing system includes a coordinated controller engine to: determine a number of liquid loop set-points and a number of air loop set-points, determine a number of system parameters corresponding to the number of liquid loop set-points and the number of air loop set-points, determine a correlation factor for the number of system parameters; and alter the number of liquid loop set-points and the number of air loop set-points based on the correlation factor to lower an energy consumption or to maximize energy reuse of a number of cooling resources associated with the number of system parameters.

9 Claims, 5 Drawing Sheets

(52) U.S. Cl.
 CPC ... *H05K 7/20281* (2013.01); *G06F 2200/201* (2013.01); *Y02D 10/16* (2018.01)

(56) References Cited

U.S. PATENT DOCUMENTS

| | | | |
|---|---|---|---|
| 8,850,226 | B2 | 11/2014 | Raman |
| 8,909,384 | B1* | 12/2014 | Beitelmal ............... G06F 1/206 700/19 |
| 2006/0157576 | A1 | 7/2006 | Eisenhour |
| 2009/0268404 | A1* | 10/2009 | Chu .................. H05K 7/20745 361/696 |
| 2011/0197612 | A1 | 8/2011 | Campbell |
| 2011/0239671 | A1 | 10/2011 | Malone |
| 2011/0264277 | A1 | 10/2011 | Shah |
| 2012/0197446 | A1 | 8/2012 | Glaudel |
| 2012/0230843 | A1 | 9/2012 | Ravipati |
| 2013/0027879 | A1 | 1/2013 | Saal |
| 2014/0049146 | A1* | 2/2014 | Kamaludeen ............ G06F 1/20 312/236 |
| 2014/0069626 | A1* | 3/2014 | Lin .......................... G06F 1/20 165/287 |
| 2014/0163764 | A1* | 6/2014 | Campbell ............ H05K 7/2079 700/300 |
| 2014/0163767 | A1* | 6/2014 | Campbell ............ H05K 7/2079 700/300 |
| 2015/0134123 | A1* | 5/2015 | Obinelo ................. G05B 15/02 700/277 |
| 2015/0143834 | A1* | 5/2015 | Reytblat ............ H05K 7/20718 62/259.4 |
| 2017/0231118 | A1* | 8/2017 | Cader .................. H05K 7/1497 |
| 2017/0295667 | A1* | 10/2017 | Cader ....................... G06F 1/20 |

FOREIGN PATENT DOCUMENTS

| | | |
|---|---|---|
| CN | 102745063 A | 10/2012 |
| CN | 102112826 B | 2/2013 |
| CN | 103175356 | 6/2013 |
| WO | WO-2010002388 | 1/2010 |

* cited by examiner

HYBRID COOLING CONTROL OF A COMPUTING SYSTEM

BACKGROUND

Computing systems (e.g., data centers, server racks, computing hardware, etc.) can utilize a number of methods for cooling to maintain a temperature of the computing hardware within the computing system. The cooling methods can utilize set-points to maintain corresponding temperatures for hardware within the computing systems. The set-points can be utilized to activate and/or deactivate a cooling method when a monitored temperature reaches the set-point. The cooling methods can be separated into a number of control loops (e.g., cooling distribution unit (CDU) loop, rack water loop, rack air loop, etc.) that operate independently.

DETAILED DESCRIPTION

Figure 1:
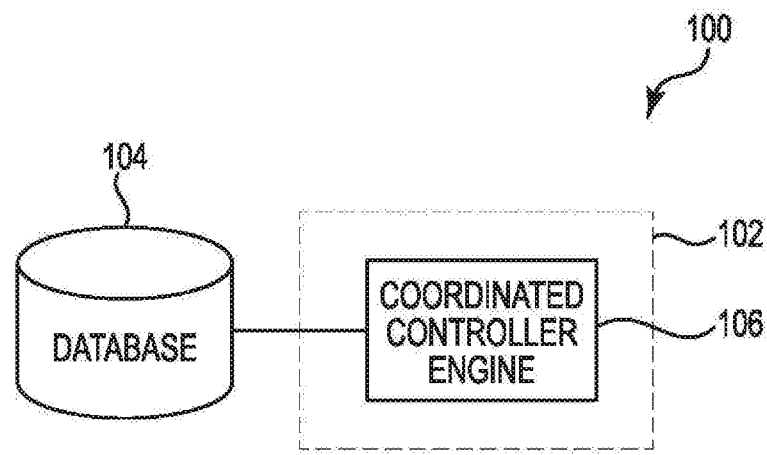
FIG. 1 illustrates a diagram of an example of a system for hybrid cooling control of a computing system consistent with the present disclosure.

A number of methods, systems, and computer readable medium for hybrid cooling control of a computing system are described herein. The hybrid cooling control of a computing system can include a number of individual cooling loops (e.g., liquid cooling loop, air cooling loop, etc.) to maintain a temperature of the computing system. For example, the hybrid cooling control system can include a liquid loop that can include a number of cooling distribution units (CDUs) that are coupled to a number of heat exchangers (HEX) and/or component water cooling loops (e.g., IT water cooling loops (ITWCL)). In addition, the hybrid cooling control system can include an air loop that can include a number of heat exchanger fans, rack fans, and/or server fans to circulate air within the computing system. The hybrid cooling control system can utilize the liquid loop and the air loop simultaneously to maintain a temperature of hardware within the computing system.

Previous cooling systems for computing systems can operate a liquid loop and an air loop independently. Operating the liquid loop and air loop independently can result in inefficient energy utilization, power utilization (e.g., maximum power utilization, etc.), and/or wasting cooling capacity (e.g., excessive cooling resource usage, etc.). For example, previous cooling systems can increase a cooling capacity of the liquid loop and/or the air loop without considering the energy consumption or a correlation factor between the set-points of the liquid loop and air loop. As used herein, the correlation factor (e.g., sensitivity functions, input changes and corresponding output changes) can be a value that represents how a set-point of the liquid loop or air loop affects the performance metrics of the cooling system and/or an energy consumption or energy reuse of the cooling system. The set-points can be settings that indicate when a cooling resource is activated and/or deactivated. For example, the set-points of the liquid loop can include a set-point that indicates a temperature at which a pump speed is to be increased. In another example, the set-points can be compared to real-time measurements (e.g., real-time component return water temperature, server component temperatures, etc.) and the cooling resources (e.g., cooling devices associated with cooling loops, etc.) can be activated, deactivated, and/or altered based on the comparison between the set-points and the real-time measurements.

The set-points can be utilized in a number of control loops. The control loops can be utilized to compare the set-points to the real-time measurements. In some examples, there can be a first control loop for a liquid loop and a second control loop for an air loop. That is, a physical liquid cooling loop can include a first control loop that can be utilized to compare liquid loop set-points to real-time measurements (e.g., component supply water temperatures, server component temperatures, etc.) and a physical air cooling loop can include a second control loop that can be utilized to compare air loop set-points to real-time measurements (e.g., inlet air temperature, server air pressure drop, etc.), The hybrid cooling control of a computing system as described herein can include determining a number of sensitivity functions for a number control loops of a cooling system, determining a number of real-time performance metrics for the number of control loops, defining a number of policies for each of the number of control loops based on the number of sensitivity functions, and altering a number of set-points for the number of control loops based on the number of policies and in response to the number of real-time performance metrics. In some examples, the number of set-points can be altered individually. That is, an absolute value of a particular set-point can be altered.

The number of policies can define set-point alterations that can increase an energy efficiency of the entire cooling system. In some examples, determining the number of sensitivity functions includes comparing a number of efficiency tradeoffs between a number of set-point alterations for the number of control loops. As used herein, the number of sensitivity functions include efficiency tradeoffs and/or correlation factors between set-points of cooling system controllers. The correlation factors can include a value that represents how changes to an input of the cooling system (e.g., set-point changes, etc.) can affect changes to an output of the cooling system (e.g., real-time performance metrics, etc.). The correlation factors and/or sensitivity functions can be utilized to optimize energy utilization of the cooling system.

Figure 2:
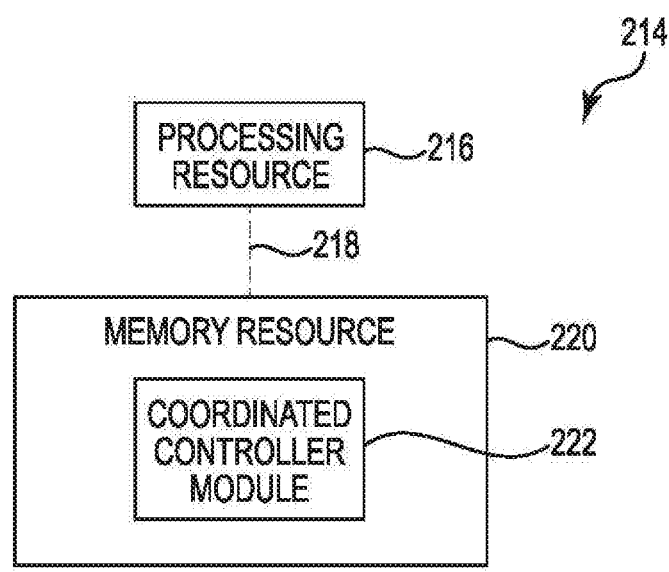
FIG. 2 illustrates a diagram of an example computing device consistent with the present disclosure.

FIGS. 1 and 2 illustrate examples of system 100 and computing device 214 consistent with the present disclosure. FIG. 1 illustrates a diagram of an example of a system 100 for hybrid cooling control of a computing system consistent with the present disclosure. The system 100 can include a database 104, a hybrid cooling control system 102, and/or a number of engines (e.g., coordinated controller engine 106, etc.). The hybrid cooling control system 102 can be in communication with the database 104 via a communication link, and can include the number of engines (e.g., coordinated controller engine 106, etc.). The hybrid cooling control system 102 can include additional or fewer engines that are illustrated to perform the various functions as will be described in further detail in connection with FIGS. 3-6.

The number of engines (e.g., coordinated controller engine 106, etc.) can include a combination of hardware and programming, but at least hardware, that is configured to perform functions described herein (e.g., determine a number of liquid loop set-points and a number of air loop set-points, determine a number of system parameters (e.g., fan speed, pump speed, actuator position, inlet air temperature, real-time performance metrics, etc.) corresponding to the number of liquid loop set-points and the number of air loop set-points, determine a correlation factor for the number of system parameters, alter the number of liquid loop set-points and the number of air loop set-points based on the correlation factor to lower an energy consumption or to maximize energy reuse of a number of cooling resources associated with the number of system parameters, etc.). The programming can include program instructions (e.g., software, firmware, etc.) stored in a memory resource (e.g., computer readable medium, machine readable medium, etc.) as well as hard-wired program (e.g., logic).

The coordinated controller engine 106 can include hardware and/or a combination of hardware and programming, but at least hardware, to determine a number of liquid loop set-points and a number of air loop set-points. The number of liquid loop set-points can be system parameter settings corresponding to a liquid cooling system. For example, the system parameter settings of the liquid cooling system can include pump speed, pump pressure, inlet liquid temperature, component return water temperature (e.g., outlet liquid temperature), among other settings of a liquid cooling system that can be adjusted. The number of air loop set-points can be system parameter settings corresponding to an air cooling system. For example, the system parameter settings corresponding to the air cooling system can include fan speed, air inlet temperature, and/or air outlet temperature, among other settings of an air cooling system that can be adjusted. In some examples, the controllers may not be able to tune or alter the temperatures of their corresponding control loops, but instead utilize a number of actuators to alter cooling resources (e.g., water or air temperatures, pressures or flow rates, etc.).

The coordinated controller engine 106 can include hardware and/or a combination of hardware and programming, but at least hardware, to determine a number of system parameters corresponding to the number of liquid loop set-points and the number of air loop set-points. Determining the number of system parameters can include determining real-time performance metrics of the cooling system. For example, determining the number of system parameters can include determining a fan speed, determining a pump speed, determining an inlet air temperature, determining an inlet liquid temperature, determining an outlet air temperature, determining an component return water temperature (e.g., outlet liquid temperature), among other real-time performance metrics of the cooling system. In some examples, the number of liquid loop set-points can alter the number of system parameters corresponding to the air loop set-points. In addition, the number of air loop set-points can alter the number of system parameters corresponding to the liquid loop set-points.

The coordinated controller engine 106 can include hardware and/or a combination of hardware and programming, but at least hardware, to determine a correlation factor for the number of system parameters. The correlation factor can be a value that represents how a set-point of the liquid loop or air loop affects the performance metrics of the cooling system and/or an energy consumption of the cooling system. For example, a set-point of component return water temperature can have a correlation factor that can indicate increasing the set-point of the component return water temperature can affect with the inlet water temperature. That is, the correlation factor can represent a trade-off between the component return water temperature and the inlet water temperature. In this example, the correlation factor can be utilized to optimize energy consumption of the cooling system. That is, the correlation factor can be used to determine set-points to adjust that can optimize energy consumption and increase cooling capacity of the cooling system. In some examples, the correlation factor for the number of system parameters represents an altered energy consumption of a number of cooling resources associated with the number of system parameters for each of the number of air loop set-points and the number of liquid loop set-points. The correlation factor can represent an altered energy consumption of a number of cooling resources associated with the number of system parameters and an altered cooling capacity utilization of a liquid loop and an air loop.

The coordinated controller engine 106 can include hardware and/or a combination of hardware and programming, but at least hardware, to alter the number of liquid loop set-points and the number of air loop set-points based on the correlation factor to lower an energy consumption or to maximize energy reuse of a number of cooling resources associated with the number of system parameters. The coordinated controller engine 106 can alter the number of liquid loop and air loop set-points based on the correlation factors assigned to each of the set-points and the real-time system parameters of the cooling system. That is, the coordinated controller engine 106 can tune a number of set-points for a number of individual control loops to lower an energy consumption or to maximize energy reuse of a number of cooling resources associated with the number of system parameters. In some examples, the coordinated controller engine 106 can tune the number of set-points corresponding to a number of individual controllers that can be utilized to alter a number of actuators to adjust the cooling capacity of a corresponding control loop.

FIG. 2 illustrates a diagram of an example computing device 214 consistent with the present disclosure. The computing device 214 can utilize software, hardware, firmware, and/or logic to perform functions described herein.

The computing device 214 can be any combination of hardware and program instructions configured to share information. The hardware, for example, can include a processing resource 216 and/or a memory resource 220 (e.g., computer-readable medium (CRM), machine readable medium (MRM), database, etc.). A processing resource 216, as used herein, can include any number of processors capable of executing instructions stored by a memory resource 220. Processing resource 216 may be implemented in a single device or distributed across multiple devices. The program instructions (e.g., computer readable instructions (CRI)) can include instructions stored on the memory resource 220 and executable by the processing resource 216 to implement a desired function (e.g., receive real-time parameters for an air loop and a liquid loop of a cooling system, determine set-points of the cooling system, wherein the set-points include air loop set-points and liquid loop set-points, determine a correlation factor between the set-points of the cooling system and the real-time parameters for the air loop and the liquid loop, alter a number of set-points of the cooling system based on the correlation factor to increase an efficiency of the cooling system, etc.).

The memory resource 220 can be in communication with a processing resource 216. A memory resource 220, as used herein, can include any number of memory components capable of storing instructions that can be executed by processing resource 216. Such memory resource 220 can be a non-transitory CRM or MRM. Memory resource 220 may be integrated in a single device or distributed across multiple devices. Further, memory resource 220 may be fully or partially integrated in the same device as processing resource 216 or it may be separate but accessible to that device and processing resource 216. Thus, it is noted that the computing device 214 may be implemented on a participant device, on a server device, on a collection of server devices, and/or a combination of the participant device and the server device.

The memory resource 220 can be in communication with the processing resource 216 via a communication link (e.g., a path) 218. The communication link 218 can be local or remote to a machine (e.g., a computing device) associated with the processing resource 216. Examples of a local communication link 218 can include an electronic bus internal to a machine (e.g., a computing device) where the memory resource 220 is one of volatile, non-volatile, fixed, and/or removable storage medium in communication with the processing resource 216 via the electronic bus.

A number of modules (e.g., coordinated controller module 222, etc.) can include CRI that when executed by the processing resource 216 can perform functions. The number of modules (e.g., coordinated controller module 222, etc.) can be sub-modules of other modules. In another example, the number of modules (e.g., coordinated controller module 222, etc.) can comprise individual modules at separate and distinct locations (e.g., CRM, etc.).

Each of the number of modules (e.g., coordinated controller module 222, etc.) can include instructions that when executed by the processing resource 216 can function as a corresponding engine as described herein. For example, the coordinated controller module 222 can include instructions that when executed by the processing resource 216 can function as the coordinated controller engine 106.

Figure 3:
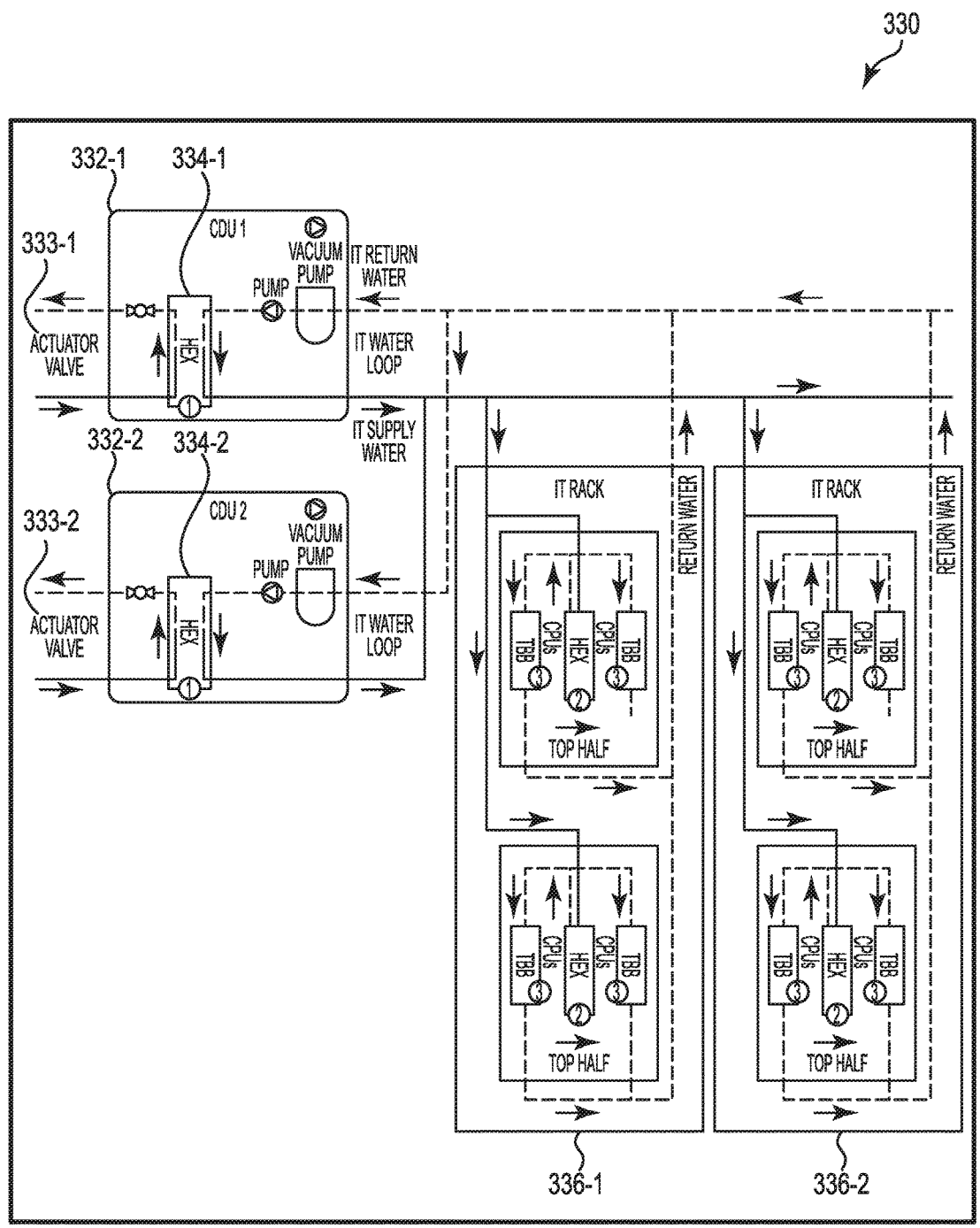
FIG. 3 illustrates a diagram of an example of a system for hybrid cooling control of a computing system consistent with the present disclosure.

FIG. 3 illustrates a diagram of an example of a system 330 for hybrid cooling control of a computing system consistent with the present disclosure. The system 330 can include a number of server racks 336-1, 336-2 that can utilize a cooling system. The server racks 336-1, 336-2 can include computing hardware cooled by a cooling system. The cooling system can include a number of cooling loops (e.g., liquid cooling loop, air cooling loop, etc.).

The system 330 can include a liquid cooling loop that can include a number of cooling distribution units (CDU) 332-1, 332-2. The number of CDUs 332-1, 332-2 can provide liquid to cool hardware of the server racks 336-1, 336-2 via a liquid cooling loop. The number of CDUs 332-1, 332-2 can be coupled to a chiller that provides cool liquid to a number of racks 336-1, 336-2 via a number of liquid pumps and/or liquid lines (e.g., liquid pipes, etc.). The chiller can utilize a heat exchanger (e.g., heat exchanger 334-1, heat exchanger 334-2, etc.) to remove heat from the liquid returning from the server racks 336-1, 336-2, and to isolate the IT from what is usually "dirty" facility water, The number of CDUs 332-1, 332-2 can circulate the liquid via a number of liquid lines coupled to the server racks 336-1, 336-2. The liquid lines can be coupled to IT water cooling loops (ITWCL) and/or heat exchangers within each of the number of server racks 336-1, 336-2. The ITWCLs and/or heat exchangers within the number of server racks 336-1, 336-2 can be utilized to maintain a temperature of computing hardware within the server racks 336-1, 336-2. That is, the liquid can be utilized to remove heat generated by the computing hardware within the server racks 336-1, 336-2.

In some examples, the cooling system can include an air loop. The air loop can include a number of rack fans, heat exchanger fans, and/or server fans that can be utilized to circulate air within server racks 336-1, 336-2. The air loop can be utilized to provide air cooling to the server racks 336-1, 336-2. The air loop can utilize (e.g., manipulate, etc.) inlet air at a particular temperature and circulate the inlet air through the server racks 336-1, 336-2. The inlet air can be utilized to remove heat from the computing hardware within the server racks 336-1, 336-2.

The cooling system can utilize a number of set-points to control the number of cooling loops (e.g., air loops, liquid loops, etc.). Each of the number of cooling loops can have set-points to activate, deactivate, and/or adjust cooling resources (e.g., cooling devices, etc.) as based on real-time parameter feedback. As described herein, the set-points can be compared to real-time parameter feedback, and based upon the comparison, a number of actuator adjustments can be made by a corresponding controller to activate, deactivate, and/or adjust a cooling resource corresponding to the set-point. For example, the liquid cooling loop can include a set-point for water temperature. In this example, the actual water temperature can be the real-time parameter feedback. In this example, a set-point for water temperature can be set at a particular temperature and when the water temperature reaches the particular temperature a chiller can be activated, switched to a particular operation model, and/or tuned through a number of temperature set-points to begin cooling the water to a lower temperature than the particular temperature. In some examples, when the water temperature reaches the particular temperature a CDU actuator valve 333-1, 333-2 can be opened to a greater level (e.g., opened more, etc.) to allow additional facility water flowing through the heat exchangers within the IT racks 336-1, 336-2 and potentially yielding cooler IT water. The liquid loop and the air loop can include a number of different set-points that can operate independently based on independent real-time parameter feedback to control various performance metrics of the cooling system.

The system 330 can integrate the number of different set-points and adjust the number of different set-points to optimize energy efficiency of the cooling system. The system 330 can utilize real-time performance metrics of the cooling system with a number of correlation factors to adjust set-points of the number of cooling loops. The number of correlation factors can include representative values for each of the number of set-points. The representative values can be values that indicate how an adjustment of a set-point affects performance metrics of the cooling system. For example, a set-point for water temperature can include a correlation factor that indicates a relationship between a particular temperature set-point and performance metrics of the cooling system. In addition, the set-point for water temperature can be assigned a correlation factor that indicates a relationship between a particular temperature set-point and energy utilization of the cooling system.

The correlation factors for the set-points can be utilized to generate a number of profiles for the cooling system. The number of profiles can be utilized to adjust the set-points to optimize the performance metrics and the energy utilization of the cooling system. The system 330 can be utilized to optimize energy efficiency of an overall cooling system by altering set-points based on the number of profiles.

Figure 4:
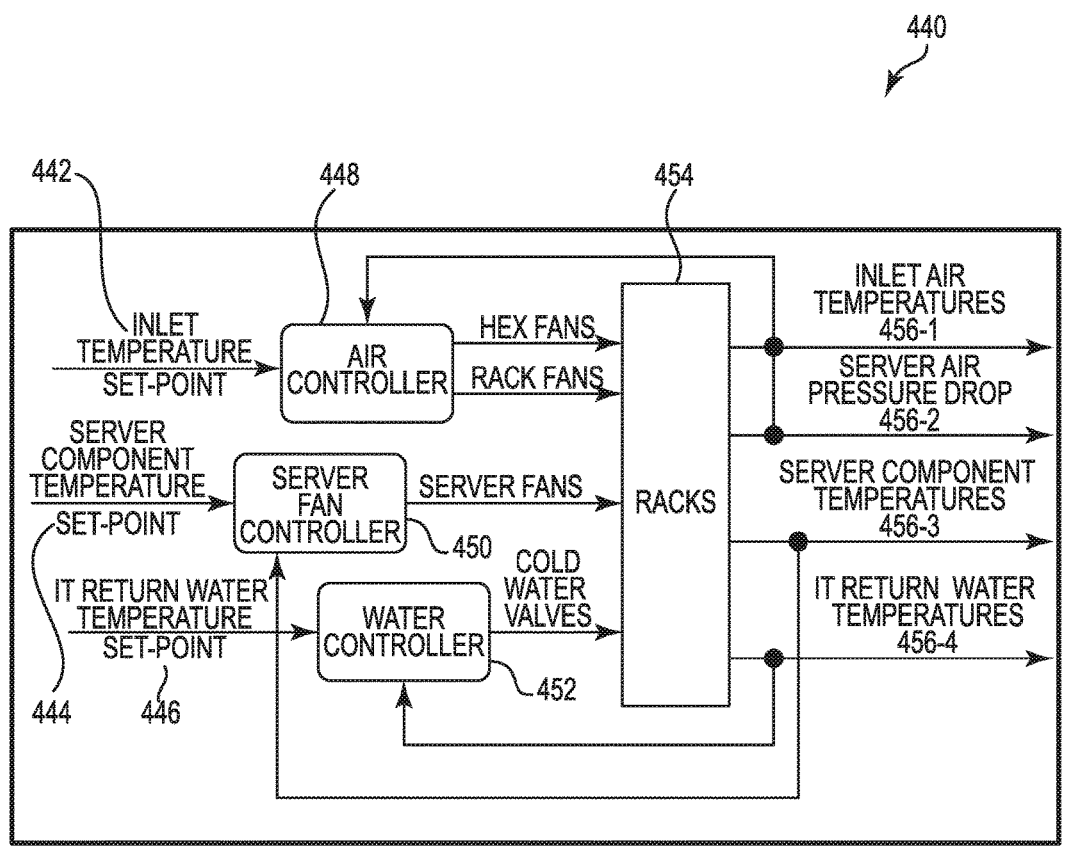
FIG. 4 illustrates a diagram of an example of a system for hybrid cooling control of a computing system consistent with the present disclosure.

FIG. 4 illustrates a diagram of an example of a system 440 for hybrid cooling control of a computing system consistent with the present disclosure. The system 440 can represent a number of controllers (e.g., air controller 448, server fan controller 450, water controller 452, etc.) that can be utilized to control settings (e.g., set-points, actuator settings, etc.) for a number of cooling loops.

The number of controllers can utilize a number of set-points (e.g., inlet temperature set-point 442, server component temperature set-point 444, component return water temperature set-point 446, etc.) to activate, deactivate, or adjust settings for cooling loops (e.g., air loop, liquid loop, etc.). For example, the air controller 448 can utilize the inlet temperature set-point 442 to adjust heat exchanger fans and/or rack fans of the server rack 454. A number of monitors can be utilized to monitor the performance metrics of the server rack 454 and provide the number of performance metrics to each of the number of controllers.

In previous cooling systems the controllers can act independently to adjust the settings of the cooling loops. By acting independently based on the received number of set-points, the number of controllers can adjust set-points of the number of cooling loops without considering how the adjustments can affect other performance metrics of the cooling system. In addition, acting independently based on the received number of set-points can result in excessive energy consumption by the cooling system In some previous computing systems the set-points of the controllers were adjusted manually to adjust the controllers individually.

The system 440 can determine a number of correlation factors of the set-points for the number of controllers. The number of correlation factors can be determined based on real-time performance metrics 456-1, 456-2, 456-3, 456-4 of the server rack 454 at each of a number of set-point combinations. For example, an inlet temperature set-point for the air controller 448 can affect a server air pressure drop 456-2, a server component temperature 456-3, and/or an component return water temperature 456-4 of the server rack 454. In this example, an alteration to the inlet temperature set-point can affect the real-time performance metrics 456-1, 456-2, 456-3, 456-4 of the server rack 454. The effect that alterations of the inlet temperature set-point have on the real-time performance metrics 456-1, 456-2, 456-3, 456-4 of the server rack 454 can be utilized to generate a correlation factor for the inlet temperature set-point. That is, the correlation factor of the inlet temperature set-point can represent how altering the inlet temperature set-point affects the real-time performance metrics 456-1, 456-2, 456-3, 456-4 of the server rack 454. In some examples, the correlation factor of the inlet temperature set-point can also represent changes in energy consumption of the cooling system.

The correlation factors for each of the set-points corresponding to each of the controllers can be utilized to generate a number of profiles for the system 440. The number of profiles can define what controller set-points are adjusted based on the real-time performance metrics 456-1, 456-2, 456-3, 456-4 of the server rack 454 and the correlation factors for each of the set-points. In some examples, the number of profiles can be utilized to increase cooling capacity utilization of the system 440 while also optimizing energy consumption of the system 440.

Figure 5:
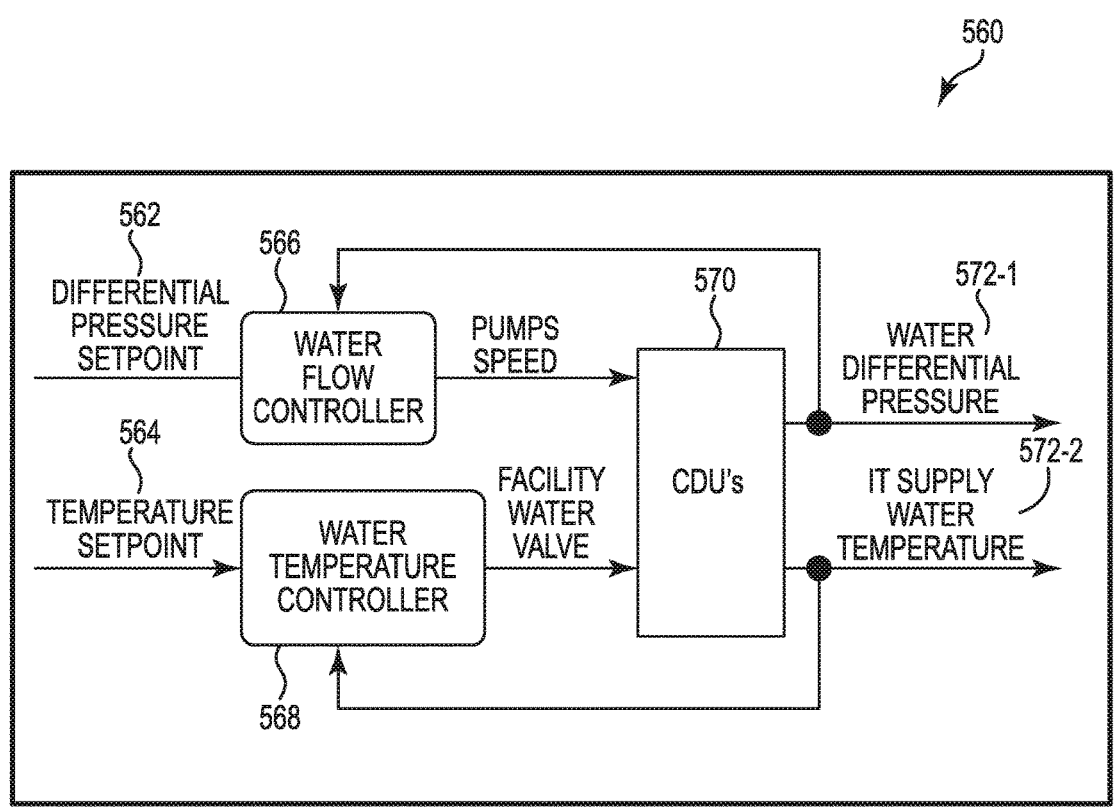
FIG. 5 illustrates a diagram of an example of a system for hybrid cooling control of a computing system consistent with the present disclosure.

FIG. 5 illustrates a diagram of an example of a system 580 for hybrid cooling control of a computing system consistent with the present disclosure. The system 580 can represent an example liquid loop of a cooling system. The liquid loop can include a water flow controller 566 and a water temperature controller 568. The water flow controller 566 can be utilized to regulate the liquid flow of a cooling distribution unit (CDU) 570 utilizing a number of set-points 562, 564. The water temperature controller 568 can be utilized to regulate the liquid temperature of a CDU 570. The water temperature controller 568 can utilize a number of set-points 564 that can be utilized to activate, deactivate, and/or alter settings of a number of liquid pumps as described herein.

The water flow controller 566 can utilize real-time differential pressure 572-1 received from a number of monitors within the CDU 570 to activate, deactivate, and/or alter settings of a number of liquid pumps of the CDU 570. That is, the water flow controller 566 can have a particular differential pressure set-point 562 that can be utilized to alter pump speeds based on received real-time differential pressures 572-1. In some examples, altering the pump speed based on the received real-time differential pressures 572-1 can also affect other real-time parameters (e.g., component supply water temperature 572-2, etc.).

The water temperature controller 568 can utilize a temperature set-point 564 in a similar manner as the water flow controller 566. That is, the water temperature controller 568 can receive real-time component supply water temperatures 572-2 (e.g., component supply water temperatures, etc.) from a number of monitors coupled to the CDU 570 and based on the temperature set-point 564, the water temperature controller 568 can alter a facility water valve to alter the component supply water temperature 572-2 of the CDU 570. In some examples, altering the facility water valve may also affect other real-time parameters of the system 580. In some examples, the number of monitors coupled to the CDU 570 can be located within an IT rack. In addition, there can be a plurality of monitors located at various areas of the cooling system. The plurality of monitors can provide a number of monitored temperature values among other real-time parameters (e.g., air temperature, water temperature, component temperature, energy utilization, fan speed, pump speed, etc.) that can be monitored. In some examples, the water temperature controller 568 can utilize at least one of: a maximum received value from the number of monitors, a minimum received value, or an average received value (e.g., mean, medium, etc.).

In some examples, the differential pressure set-point 562 and the temperature set-point 564 can be assigned a correlation factor based on the received real-time parameters 572-1, 572-2 when alterations to the differential pressure set-point 562 and the temperature set-point 564 are implemented. The correlation factors can be utilized to generate profiles for the system 580. The profiles for the system 580 can include the correlation factors and set-point alterations that can increase cooling efficiency and optimize energy utilization of the system 580.

Figure 6:
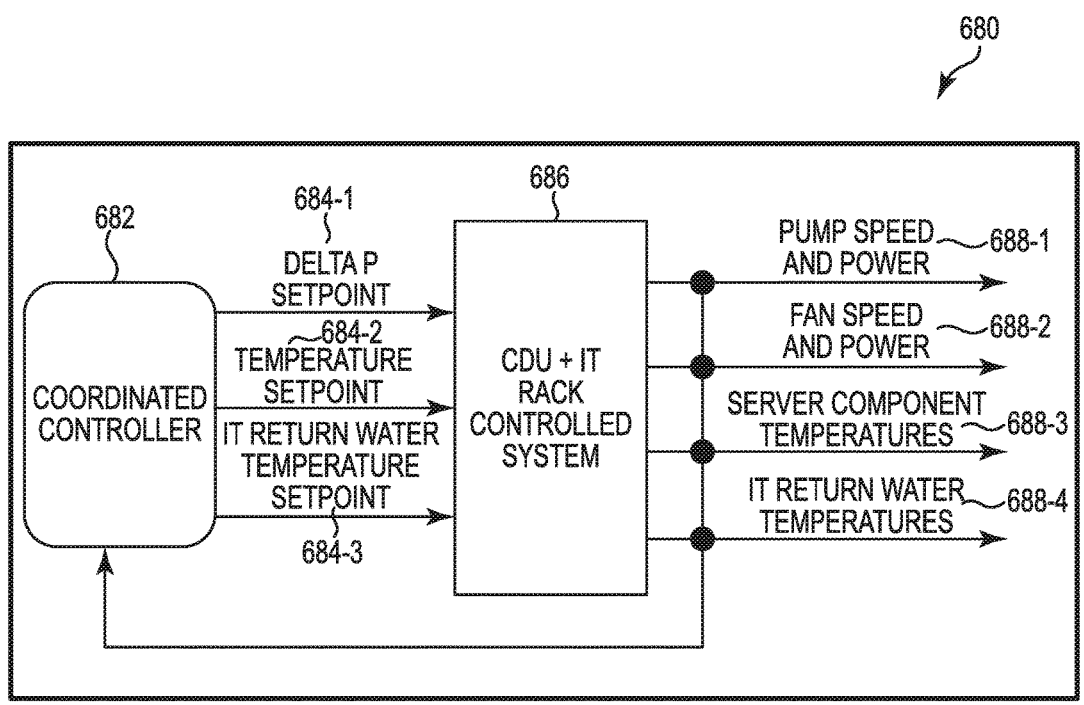
FIG. 6 illustrates a diagram of an example of a system for hybrid cooling control of a computing system consistent with the present disclosure.

FIG. 6 illustrates a diagram of an example of a system 680 for hybrid cooling control of a computing system consistent with the present disclosure. The system 680 can include cooling distribution unit (CDU) and server rack controlled systems 686 to simultaneously control air loops and liquid loops as described herein. The air loops and liquid loops can be simultaneously controlled by a coordinated controller 682. In some examples, the coordinated controller 682 can replace the functions of the number of controllers described herein (e.g., air controller, server fan controller, water controller, water flow controller, water temperature controller, etc). In some examples, the coordinated controller 682 can be utilized to manage and/or control one or more of the number of controllers described herein. That is, the coordinated controller 682 can send instructions to a number of lower level controllers. In this example, the lower level controllers can make set-point alterations as described herein in response to the received instructions from the coordinated controller 682.

The coordinated controller 682 can include a plurality of set-points (e.g., change in pressure set-point 684-1, temperature set-point 684-2, component return water temperature set-points 684-3, etc.) corresponding to a number of controllers of the liquid loop and air loop as described herein. The coordinated controller 682 can utilize the set-points for the number of controllers to activate, deactivate, and/or alter settings of cooling equipment associated with the number of controllers. For example, the set-points can be utilized to activate, deactivate, and/or alter a fan speed of a rack fan that is associated with a fan controller.

The coordinated controller 682 can receive a number of real-time performance metrics 688-1, 688-2, 688-3, 688-4 of the CDU and server rack system 686. The real-time performance metrics can include, but are not limited to: pump speed and pump power 688-1, fan speed and fan power 688-2, server component temperatures 688-3, and/or component return water temperatures 688-4. The coordinated controller 682 can determine a number of correlation factors for the number of set-points 684-1, 684-2, 684-3. The correlation factors can be assigned to each of the number of set-points 684-1, 684-2, 684-3. As described herein, the correlation factors can represent how particular set-points 684-1, 684-2, 684-3 can affect the real-time performance metrics 688-1, 688-2, 688-3, 688-4 of the CDU and server rack system 686. In addition, the correlation factors can represent how particular set-points 684-1, 684-2, 684-3 can affect the system's energy consumption or reuse of the energy (e.g., energy reuse, etc.) contained in the exhaust water (e.g., component return water, eta) of the IT racks. In some examples, the pump speed and power metric 688-1 and/or the fan speed and power metric 688-2 can be used to quantify cooling energy consumption of the cooling system 680.

In some examples, the correlation factors can be assigned to a number of set-point combinations. For example, a correlation factor can be assigned to a combination of various set-points 684-1, 684-2, 684-3. In this example, different combinations of various set-points 684-1, 684-2, 684-3 can affect the real-time performance metrics 688-1, 688-2, 688-3, 688-4 of the CDU and server rack system 686 as well as affect the energy consumption of the CDU and server rack system 686. As described herein, the correlation factors can be utilized to generate a number of profiles that can be utilized by the coordinated controller 682 to adjust the number of set-points 684-1, 684-2, 684-3 for optimizing cooling capacity and optimizing energy consumption of the CDU and server rack system 686, or the reuse of the energy contained in the exhaust water of the IT racks (e.g., energy reuse, etc.). Thus, the correlation factor can include direct and indirect alteration values for real-time parameters for the air loop and the liquid loop of the cooling system.

In some examples, the system 680 can operate in a two layer control functionality. That is, there can be a first layer where performance metrics are controlled through individual control loops of real-time performance metrics. The first layer can be similar to operating the number of controllers independently based on independent real-time parameter feedback as described herein. In addition, there can be a second layer where the control loops of real-time performance metrics are tuned for coordination and energy consumption optimization. The second layer can be utilized to simultaneously control a number of different cooling loops based on correlation factors to provide higher cooling capacity efficiency with higher power and energy consumption efficiency.

In some examples, the system 680 can utilize correlation factors that are based on tradeoffs between set-point alterations. In some examples, the tradeoffs can be between performance metrics of different cooling control loops. In some examples, the tradeoffs can be between performance metrics of the same cooling control loop. In addition, the tradeoffs can be between performance metrics of different cooling methods. For example, the correlation factors can be based in a tradeoff between an component supply water temperature and a flow rate. In this example, the component supply water temperature can be controlled by altering a facility water valve and the flow rate can be controlled by altering a pump speed. In this example, the cooling capacity of the component supply water is proportional to the component supply water temperature and flow rate of the component supply water. In this example, increasing the flow rate or reducing the temperature of the component supply water can both increase the cooling capacity; however the CPU temperature can be more sensitive to the water temperature than the flow rate. Thus, in this example, the correlation factor can be utilized to instruct the coordinated controller 682 to lower the water temperature before increasing the flow rate. In some examples, the correlation factor can be utilized to instruct the coordinated controller 682 to decrease the flow rate and/or increase the component supply water temperature to maximize the component return temperature for energy reuse purposes.

In another example, the tradeoff can be between cooling methods (e,g., liquid cooling, air cooling, etc.). In this example, the coordinated controller 682 can receive fan speeds from an air cooling method. In this example, the fan speed can reach a point that is not at an efficient rate of energy utilization (e.g., greater than 80%, etc.). In this example, the coordinated controller 682 can lower the fan speed by lowering an component supply water temperature of a liquid cooling method. Thus, in this example, a correlation factor or profile can be utilized to instruct the coordinated controller 682 to utilize a lower water temperature to lower fan speed while increasing the energy efficiency of the system 680.

In another example, the tradeoff can be between the component return water temperature and an component supply water temperature control of the liquid cooling method and/or liquid loop. The correlation among the component return water temperature, flow rate (e.g., pump speed), and the component supply water temperature can include a correlation factor that can be utilized to instruct the coordinated controller 682 to tune the pressure change, inlet water temperature, and/or component supply water temperature set-points to optimize the overall energy efficiency of the system 680. In this example, the component return water temperature and the component supply temperature can affect an optimal pump speed for cooling capacity. Thus, the coordinated controller 682 can utilize a correlation factor assigned to combinations of component supply water temperature, component return water temperature, and pump speed to alter corresponding set-points to increase cooling capacity and/or optimize energy utilization. In some examples, the system 680 can respond to an overheating of the computing components. In these examples, the local and/or lower level controllers can be at a point where they can make a relatively little increase in cooling capacity for the system 680 (e.g., fans are already at 100% capacity). In these examples, the coordinated controller 682 can determine whether to lower the water temperature set-point and/or increase a flow rate of the system 680.

As used herein, "logic" is an alternative or additional processing resource to perform a particular action and/or function, etc., described herein, which includes hardware, e.g., various forms of transistor logic, application specific integrated circuits (ASICs), etc., as opposed to computer executable instructions, e.g., software firmware, etc., stored in memory and executable by a processor. Further, as used herein, "a" or "a number of" something can refer to one or more such things. For example, "a number of widgets" can refer to one or more widgets.

The above specification, examples and data provide a description of the method and applications, and use of the system and method of the present disclosure. Since many examples can be made without departing from the spirit and scope of the system and method of the present disclosure, this specification merely sets forth some of the many possible example configurations and implementations.

What is claimed is:

1. A system for hybrid cooling control of a computing system, comprising:
a coordinated controller engine to:
determine a number of liquid loop set-points and a number of air loop set-points, wherein the number of air loop set-points include set-points that correspond to an air cooling system and the number of liquid loop set-points include set-points that correspond to a liquid cooling system;
determine a number of system parameters corresponding to the number of liquid loop set-points and the number of air loop set-points;
determine a correlation factor for each of the number of system parameters, wherein each of the correlation factors is associated with activating the air cooling system based on the number of air loop set-points and simultaneously activating the liquid cooling system based on the number of liquid loop set points within the computing system; and
alter the number of liquid loop set-points and the number of air loop set-points based on each of the correlation factors to lower an energy consumption or to maximize energy reuse of a number of cooling resources associated with the number of system parameters.

2. The system of claim 1, wherein the number of liquid loop set-points alter the number of system parameters corresponding to an air loop and a liquid loop and wherein the number of air loop set-points alter the number of system parameters corresponding to the air loop and the liquid loop.

3. The system of claim 1, comprising the coordinated controller engine to alter an absolute value of a particular set-point from the number of air loop set-points or the number of liquid loop set points.

4. The system of claim 1, wherein each of the correlation factors for the number of system parameters represents an altered energy consumption of cooling devices of an air loop and a liquid loop.

5. The system of claim 1, wherein each of the correlation factors represents an altered energy consumption or energy reuse of a number of cooling resources associated with the number of system parameters and an altered cooling capacity of a liquid loop and an air loop.

6. A non-transitory computer readable medium storing instructions executable by a processing device for hybrid cooling control of a computing system, wherein the instructions are executable to:
receive real-time parameters for an air loop and a liquid loop of a cooling system;
determine set-points of the cooling system, wherein the set-points include air loop set-points that correspond to an air cooling system and liquid loop set-points that correspond to a liquid cooling system;
determine a correlation factor between each of the set-points of the cooling system and the real-time parameters for the air loop and the liquid loop, wherein each of the correlation factors is associated with activating the air cooling system based on the air loop set-points and simultaneously activating the liquid cooling system based on the liquid loop set points within the computing system; and
alter a number of the set-points of the cooling system based on each of the correlation factors to increase an efficiency of the cooling system.

7. The medium of claim 6, wherein each of the correlation factors is a representative value of cooling efficiency and energy efficiency of the cooling system.

8. The medium of claim 6, wherein the instructions to alter the number of set-points of the cooling system includes instructions to alter at least one of:
water flow rate;
supply water temperature;
component air flow rate;
component inlet air temperature;
component return water temperature; and
component outlet air temperature.

9. The medium of claim 6, wherein each of the correlation factors includes direct and indirect alteration values for set-points that correspond to the real-time parameters for the air loop and the liquid loop of the cooling system.

* * * * *